United States Patent
Joshi et al.

(10) Patent No.: US 10,312,184 B2
(45) Date of Patent: Jun. 4, 2019

(54) SEMICONDUCTOR SYSTEMS HAVING PREMOLDED DUAL LEADFRAMES

(71) Applicant: Texas Instruments Incorporated, Dallas, TX (US)

(72) Inventors: Rajeev D. Joshi, Cupertino, CA (US); Hau Nguyen, San Jose, CA (US); Anindya Poddar, Sunnyvale, CA (US); Ken Pham, San Jose, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/932,055

(22) Filed: Nov. 4, 2015

(65) Prior Publication Data
US 2017/0125324 A1    May 4, 2017

(51) Int. Cl.
*H01L 23/495*    (2006.01)
*H01L 21/48*    (2006.01)
(Continued)

(52) U.S. Cl.
CPC .... *H01L 23/49537* (2013.01); *H01L 21/4825* (2013.01); *H01L 21/4828* (2013.01);
(Continued)

(58) Field of Classification Search
CPC .......... H01L 23/49537; H01L 21/4825; H01L 21/4828; H01L 23/3121; H01L 23/49544; H01L 23/49558; H01L 23/49575; H01L 23/49582; H01L 23/49586; H01L 25/16; H01L 23/495; H01L 23/498; H01L 33/62; H01L 21/4814; H01L 23/52; H01L 23/49565; H01L 23/49503; H01L 23/49506; H01L 23/4951; H01L 23/49513;
(Continued)

(56) References Cited

U.S. PATENT DOCUMENTS 6,061,251 A * 5/2000 Hutchison ............ H01L 23/057
                                                  174/255
2004/0000702 A1 * 1/2004 Knapp ................ H01L 23/3107
                                                  257/666
(Continued)

FOREIGN PATENT DOCUMENTS

WO    2011099335    8/2011
WO    2015127159    8/2015

*Primary Examiner* — Yasser A Abdelaziez
(74) *Attorney, Agent, or Firm* — Rose Alyssa Keagy; Charles A. Brill; Frank D. Cimino

(57) ABSTRACT

A dual leadframe (100) for semiconductor systems comprising a first leadframe (110) having first metal zones separated by first gaps, the first zones including portions of reduced thickness and joint provisions in selected first locations, and further a second leadframe (120) having second metal zones separated by second gaps, the second zones including portions of reduced thickness and joint provisions (150) in selected second locations matching the first locations. The second leadframe is stacked on top of the first leadframe and the joint provisions of the matching second and first locations linked together. The resulting dual leadframe may further include insulating material (140) filling the first and second gaps and the zone portions of reduced thickness, and has insulating surfaces coplanar with the top and bottom metallic surfaces.

20 Claims, 13 Drawing Sheets

(51) Int. Cl.
*H01L 25/16* (2006.01)
*H01L 23/31* (2006.01)
*H01L 23/00* (2006.01)

(52) U.S. Cl.
CPC .. *H01L 23/49558* (2013.01); *H01L 23/49575* (2013.01); *H01L 25/16* (2013.01); *H01L 23/3121* (2013.01); *H01L 23/49544* (2013.01); *H01L 23/49582* (2013.01); *H01L 23/49586* (2013.01); *H01L 23/49589* (2013.01); *H01L 24/16* (2013.01); *H01L 24/29* (2013.01); *H01L 24/32* (2013.01); *H01L 24/33* (2013.01); *H01L 24/83* (2013.01); *H01L 2224/16245* (2013.01); *H01L 2224/291* (2013.01); *H01L 2224/2919* (2013.01); *H01L 2224/29111* (2013.01); *H01L 2224/32245* (2013.01); *H01L 2224/33181* (2013.01); *H01L 2224/40245* (2013.01); *H01L 2224/83815* (2013.01); *H01L 2224/83851* (2013.01); *H01L 2924/1032* (2013.01); *H01L 2924/1033* (2013.01); *H01L 2924/10253* (2013.01); *H01L 2924/10271* (2013.01); *H01L 2924/10329* (2013.01); *H01L 2924/1305* (2013.01); *H01L 2924/1306* (2013.01); *H01L 2924/14* (2013.01); *H01L 2924/1461* (2013.01); *H01L 2924/19041* (2013.01); *H01L 2924/19105* (2013.01)

(58) Field of Classification Search
CPC ......... H01L 23/49541; H01L 23/49861; H01L 2224/48145; H01L 23/49805; H01L 23/49589
See application file for complete search history.

(56) References Cited

U.S. PATENT DOCUMENTS

| | | | |
|---|---|---|---|
| 2005/0121756 A1* | 6/2005 | Chow | H01L 23/3107 257/676 |
| 2010/0133670 A1* | 6/2010 | Liu | H01L 23/49524 257/675 |
| 2010/0133674 A1* | 6/2010 | Hebert | H01L 23/49524 257/686 |
| 2011/0210708 A1* | 9/2011 | Herbsommer | H01L 23/49524 323/271 |
| 2012/0098110 A1* | 4/2012 | Zitzlsperger | H01L 23/3107 257/666 |
| 2012/0119343 A1* | 5/2012 | Bayan | H01L 21/4842 257/676 |
| 2012/0273826 A1* | 11/2012 | Yamamoto | H01L 33/62 257/99 |
| 2012/0273932 A1* | 11/2012 | Mao | H01L 23/49524 257/676 |
| 2014/0183574 A1* | 7/2014 | Nakabayashi | H01L 25/075 257/88 |
| 2015/0214198 A1 | 7/2015 | Lee et al. | |

* cited by examiner

SEMICONDUCTOR SYSTEMS HAVING PREMOLDED DUAL LEADFRAMES

FIELD

Embodiments of the invention are related in general to the field of semiconductor devices and processes, and more specifically to structures and processes of semiconductor systems having pre-molded stacked and mated dual leadframes.

DESCRIPTION OF RELATED ART

Electronic products have, at their core, printed circuit boards, which assemble and interconnect the semiconductor devices, passive components, control devices, power supplies, and display devices, which are needed in the particular product. Today, an increasing number of these electronic products, such as hand-held wireless telephones, smartphones, electronic cameras, light sources, power supplies, portable computers, and controls and sensors in automobiles and airplanes are subjected to market trends, which require an on-going shrinking of the product outlines and weight, and for which, therefore, the size, space, and weight required by the boards are at a premium. At the same time, electrical product requirements for higher speed and greater power are becoming more demanding.

In order to shrink board outlines, present technology focuses on reducing the board area consumed by each individual part assembled on a board; for instance, concerted efforts are expended to shrink the package of semiconductor devices and passive components. In addition, stacking of integrated circuit chips and passive components is widely practiced. It is, however, becoming ever more difficult to provide for enough thermal conductors to dissipate the generated heat, and for the high density of traces for routing signals and conducting high currents. Conflicting requirements also become more stringent for metallic leadframes: One product requirement aims at ever tighter density of signal leads, another product requirement aims at stronger power leads and areas for heat dissipation. As an example, routing of half-etched leads is limited by the frame thickness. Fine lines and dense spacing are technically possible with thin half-etched leadframes, but the leadframes become too fragile to handle.

For interposers, in addition to plastic and ceramic substrates with wire bonding and flip-chip assembly, embedded structures have been employed. In these structures, chips have been inserted and electrically connected into multi-metal-layer substrates, which can serve as completed structures or as interposers. While these embedded structures may satisfy electrical and thermal requirements and do not need plating of thick metal layers, they are subject to warpage and require an expensive fabrication sequence.

SUMMARY

Investigating ways of overcoming technical bottlenecks by distributing functions, applicants recognized that today's conflicting leadframe requirements to route more signals in ever denser leads while concurrently to conduct more power in ever more robust leads, can be resolved by mating a first leadframe dedicated to signal routing with a second leadframe dedicated to power distribution and heat dissipation, as long as the two leadframes have joints linking the two leadframes.

Applicants further recognized that by half-etching certain matching leads sufficient spaces can be created, which allow the embedding of semiconductor chips and electronic components and thus the elimination of elements such as clips and wires without sacrificing their functions. This method not only reduces the system height dramatically, it also enhances the robustness and reliability of the completed module. Last but not least, modules fabricated with the combination of the concept of distributing functions and the concept of eliminating elements without sacrificing their functions result in products of reduced cost.

One embodiment of the invention is a dual leadframe for semiconductor systems, which includes a first and a second leadframe linked together at matching joints. The joints may be selected from a group including via holes with plated contact metal, metal protrusions suitable for deformation under pressure, or metal protrusions having a solderable surface. One or both leadframes may include half-etched portions so that one or more semiconductor chips and passive electronic components can be embedded in the space provided by the half-etched portions. Another embodiment is a method for fabricating dual leadframes by aligning and linking leadframes.

Another embodiment is a dual leadframe encapsulated by an insulating material such as a molding compound. The insulating material fills any open spaces within and between the leadframes and forms insulating surfaces coplanar and alternating with the metallic leadframe surfaces.

Yet other embodiments are semiconductor modules or systems based on dual leadframes. In one system, a pre-molded dual leadframe has one or more passive components, such as an inductor, attached to a surface. In another system, one or more semiconductor chips are attached on the surface of the top leadframe, before the assembled module is encapsulated in molding compound. In yet another system, one or more semiconductor chips and passive components are embedded in spaces between the dual leadframe and additional passive components are attached to the module surface, before the assembled module is encapsulated in molding compound.

DETAILED DESCRIPTION OF THE PREFERRED EMBODIMENTS

Figure 1:
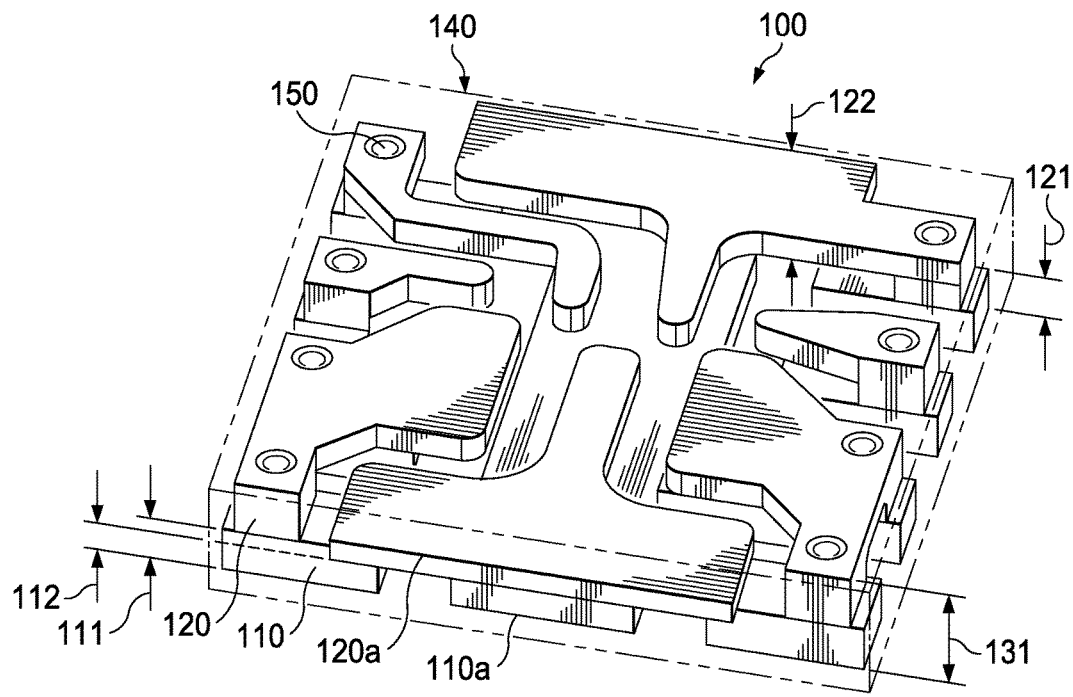
FIG. 1 shows a perspective view of a dual leadframe as an embodiment of the invention; the joint provisions in the top leadframe for linking the aligned leadframes are visible.

FIG. 1 illustrates an exemplary embodiment of the invention, a semiconductor module generally designated 100 including a dual leadframe. The dual leadframe of module 100 includes a first leadframe 110 formed below the second leadframe 120; first leadframe 110 is also referred to as bottom leadframe, and second leadframe 120 is also referred to as top leadframe. A leadframe includes a pattern of metal zones and gaps, representing the leads and pads of a leadframe. Leadframe patterns are typically stamped or etched from flat sheets of metal of a given thickness. Preferably, the flat sheet has high electrical conductivity and is a metal selected from a group including copper, copper alloys, aluminum, iron-nickel alloys, and Kovar™. When the sheet is made of copper, the preferred given, or starting, thickness of the metal sheet may be between 100 and 300 µm. For the exemplary embodiment of FIG. 1, the pattern of the first leadframe primarily provides assembly pads, power routing, and thermal energy dissipation, while the pattern of the second leadframe primarily provides electrical signal routing.

Figure 2:
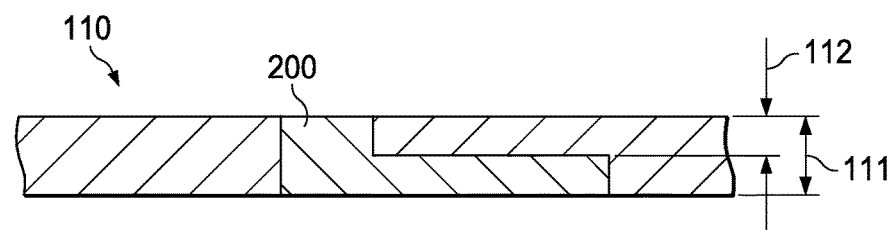
FIG. 2 is a cross section of a portion of a leadframe after a flat sheet metal has been processed through patterning, partially thinning, and filling the gaps between the metal traces with insulating material of coplanar surfaces.

In FIG. 1, first leadframe 110 is shown with a starting thickness 111, referred to as first thickness. For clarity, a portion of leadframe 110 is enlarged in FIG. 2 to depict more detail of some metal zones and gaps (in FIG. 2, the gaps are filled with insulating material 200, while in FIG. 1 the gaps are still un-filled). While some metal zones exhibit first thickness 111 throughout, other zones include portions of first thickness 111 and portions of a second thickness 112, which is smaller than the first thickness. These portions of reduced thickness are preferably made by an etching process of the starting metal and are thus often referred to as half-etched leadframe portions.

It should be pointed out that metal zones of second thickness may be aligned with matching metal zones of fourth thickness so that a space can be created suitable to embed an electronic component such as a semiconductor chip, a semiconductor device like a MEMS (Micro Electro Mechanical System), or a passive component.

In locations referred to as first locations, leadframe portions of first thickness 111 may include provisions for joints, which are needed to mate first leadframe 110 with second leadframe 120 (see joint descriptions below).

Referring to FIG. 1, second leadframe 120 includes a pattern of second metal zones separated by second gaps. Some second zones include portions of a third thickness 121 (the original thickness of the second leadframe) and portions of a fourth thickness 122 smaller than the third thickness 121. For some modules, third thickness 121 may be the same as first thickness 111, in other modules the first thickness may be greater than the third thickness. The third thickness portions including provisions for joints in selected second locations, which match the first locations.

As FIG. 1 shows, second leadframe 120 is aligned with and stacked on top of first leadframe 110. As described below, the joint provisions of both leadframes allow a mating of the leadframes by matching the joint os the second and first locations linked together. The resulting dual leadframe has a top surface 120a, a bottom surface 110a, and a thickness 131 equal to the sum of the first and third thicknesses.

FIG. 1 indicates that the dual leadframe may be encapsulated in a package 140 of insulating material. A preferred encapsulation material is a polymeric molding compound such as a thermoset epoxy formulation. During the encapsulation process, the insulating material fills the gaps and the zone portions smaller than the first and third thicknesses. The resulting composite leadframe has insulating surfaces coplanar with the bottom and top metallic surfaces (110*a* and 120*a*, respectively) of the dual leadframe. Consequently, the composite leadframe exhibits surfaces with alternating metallic and insulating regions.

Figure 3:
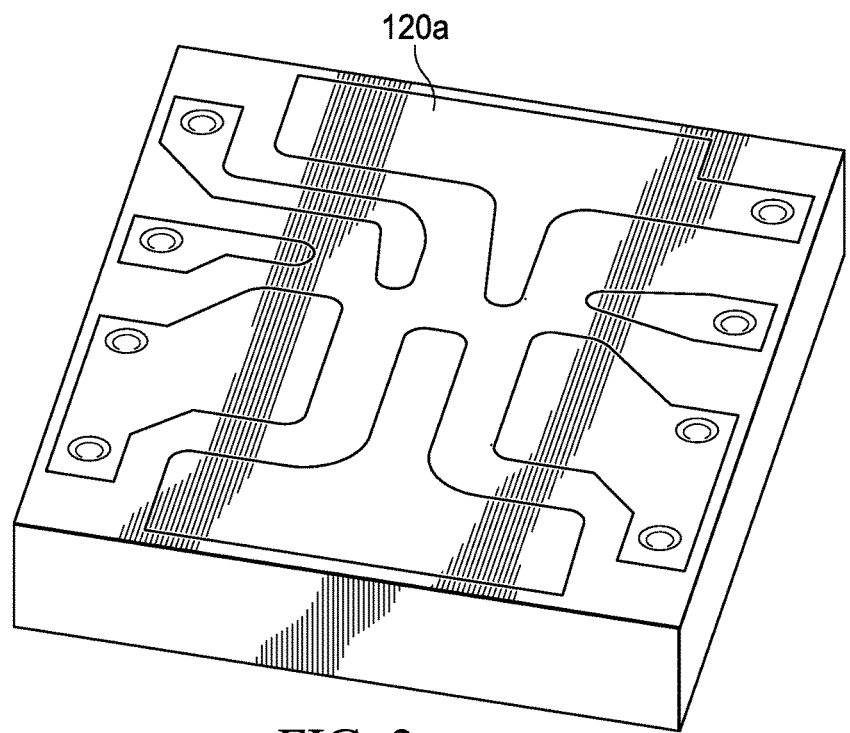
FIG. 3 displays a perspective view of the top surface of the dual leadframe of FIG. 1 after encapsulating the dual leadframe in insulating material with coplanar surface.
Figure 4:
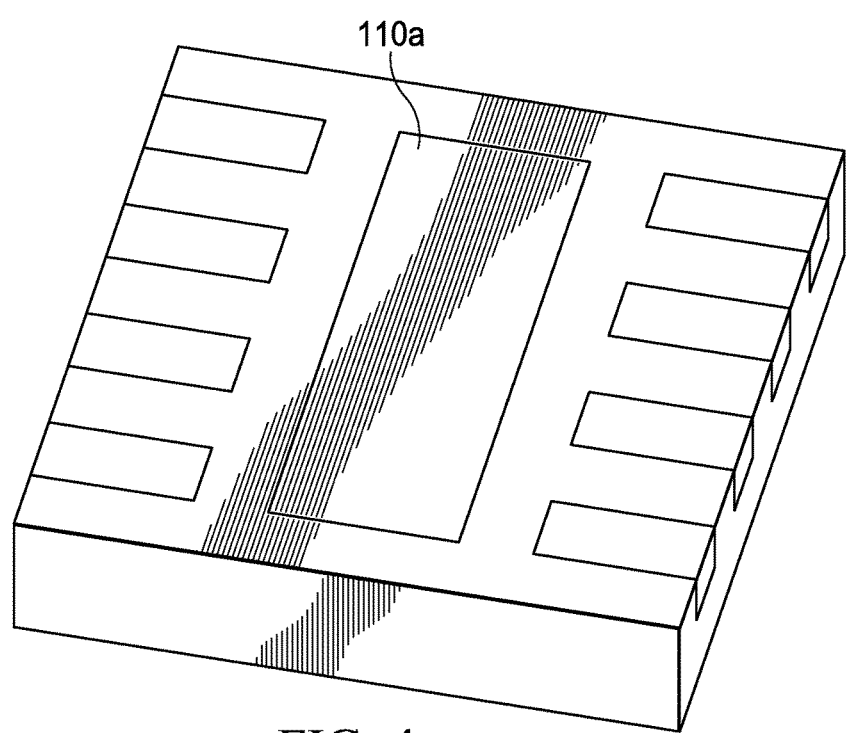
FIG. 4 shows a perspective view of the bottom surface of the dual leadframe of FIG. 1 after encapsulating the dual leadframe in insulating material with coplanar surface.

FIGS. 3 and 4 depict perspective views of the top (FIG. 3) and the bottom (FIG. 4) surface of the encapsulated dual leadframe. The metallic regions are marked (120*a* and 110*a*, respectively); the insulting regions are coplanar with the respective metallic regions. FIG. 3 demonstrates the function of signal routing of the top leadframe, and FIG. 4 demonstrates the function of power routing and thermal energy dissipation of the bottom leadframe.

Figure 5:
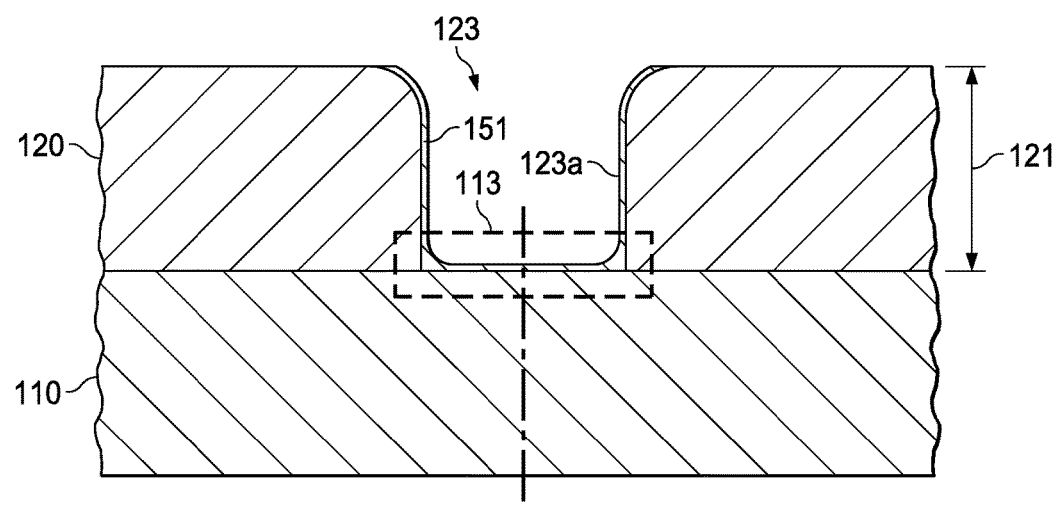
FIG. 5 illustrates a cross section through a portion of a dual leadframe, showing a via hole through the top leadframe with metal-plated walls to link aligned top and bottom leadframes.

Depicted in FIG. 1 is a plurality of locations 150 visible on the top surface of the dual leadframe, where robust joints are provided for linking the top and bottom leadframes. FIG. 5 illustrates a cross section of this specific kind of joints. The first (bottom) leadframe is designated 110, the second (top) leadframe 120. Leadframe 110 includes first locations 113, which preferably have surfaces of high affinity to the metals, which may be plated onto the walls of via holes 123. Leadframe 120 includes second locations represented by via holes 123. The second locations of via holes 123 match the first locations 113. Via holes 123 extend through the complete (third) thickness 121 of the second (top) leadframe; the sidewalls 123*a* of the via holes have an affinity to those metals 151, which may be plated as a layer onto the walls of vias 123.

In the flow of fabricating encapsulated dual leadframes, the sequence of processes includes: Etching of the via holes into the second leadframe; aligning the second leadframe with the first leadframe to match first and second locations; placing the dual leadframe in a mold so that the mold cover lies flat on the top surface to keep the via holes open; encapsulating the dual leadframe in an insulating compound while filling the leadframe gaps and thinned zone portions; and plating a metal layer 151 onto the walls of via holes 123, thereby conductively mating the second and first leadframes.

Figure 6A:
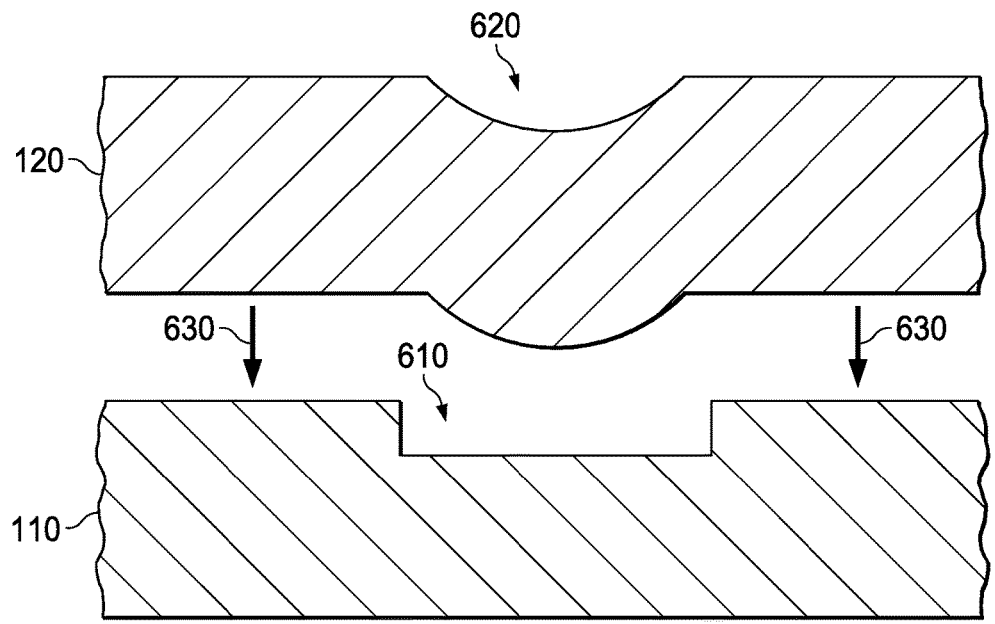
FIG. 6A shows a cross section through a portion of the top and bottom leadframes of a dual leadframe after aligning but before linking, the joint provision of the bottom leadframe providing a cavity, and the joint provision of the top leadframe providing a protrusion deformable under pressure.
Figure 6B:
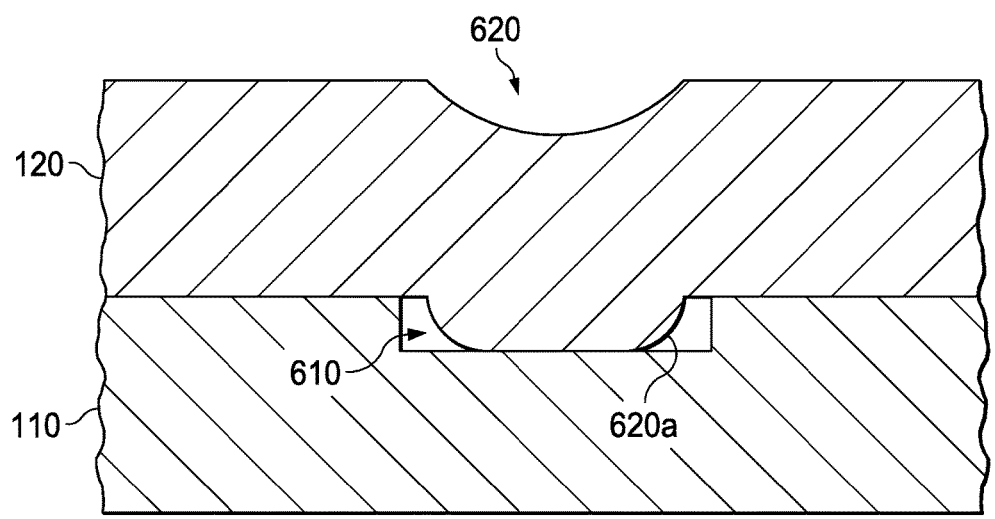
FIG. 6B displays a cross section through a portion of the top and bottom leadframes of a dual leadframe after linking, the linked joint showing the protrusion aligned in the cavity and deformed under pressure.

Another kind of joint for mating second leadframe 120 with first leadframe 110 is illustrated in FIGS. 6A and 6B. Optionally, leadframe 110, referred to as first or bottom leadframe, may have received cavities, or indents or recesses, 610 in first locations of the leadframe surface facing leadframe 120. A preferred technique for creating cavities 610 is stamping; alternatively, a coining or etching technique may be applied. Leadframe 120, referred to as second or top leadframe, has received metal protrusions 620, which can be deformed when mechanical pressure is applied in the direction 630 normal to leadframe 120; protrusions 620 are in second locations matching the first locations. Protrusions 620, also referred to as dimples or notches, are preferably formed by coining; alternatively, a stamping technique may be used.

In the fabrication flow of encapsulated dual leadframes, the sequence of processes includes: Forming cavities in first locations of the first leadframe and protrusions in matching second locations of the second leadframe; aligning the second leadframe with the first leadframe to match first and second locations (see FIG. 6A); applying pressure onto the second leadframe to touch the first leadframe and to deform the protrusions and press them into the cavities (see deformed protrusion 620*a* in FIG. 6B); optionally, the pressure may be applied at elevated temperature; and placing the dual leadframe in a mold for encapsulating the mated leadframes in an insulating compound while filling the leadframe gaps and thinned-zone portions.

Figure 7A:
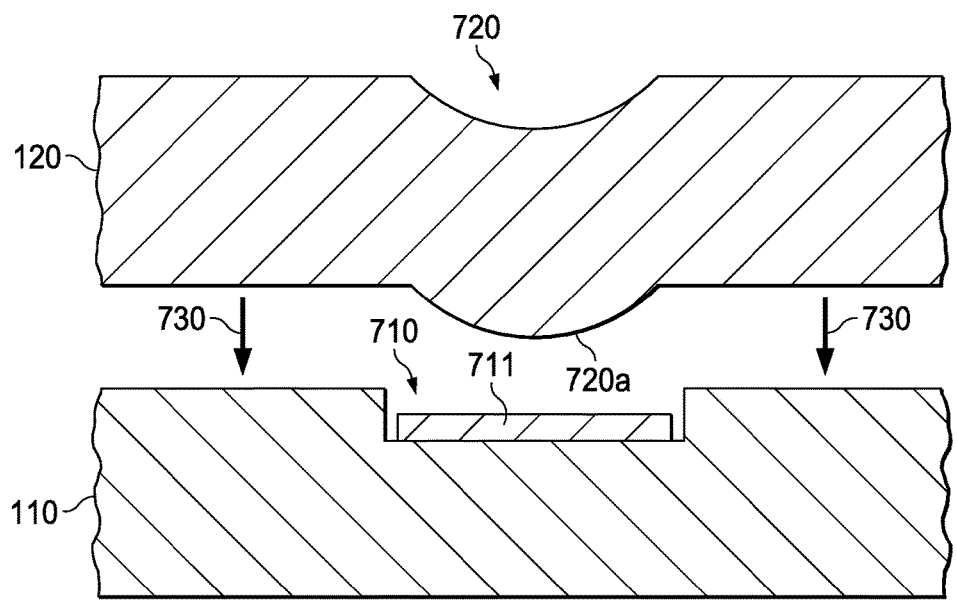
FIG. 7A shows a cross section through a portion of the top and bottom leadframes of a dual leadframe after aligning but before linking, the joint provision of the bottom leadframe providing a cavity with a layer of solderable metal, and the joint provision of the top leadframe providing a protrusion with a solderable surface and deformable under pressure.
Figure 7B:
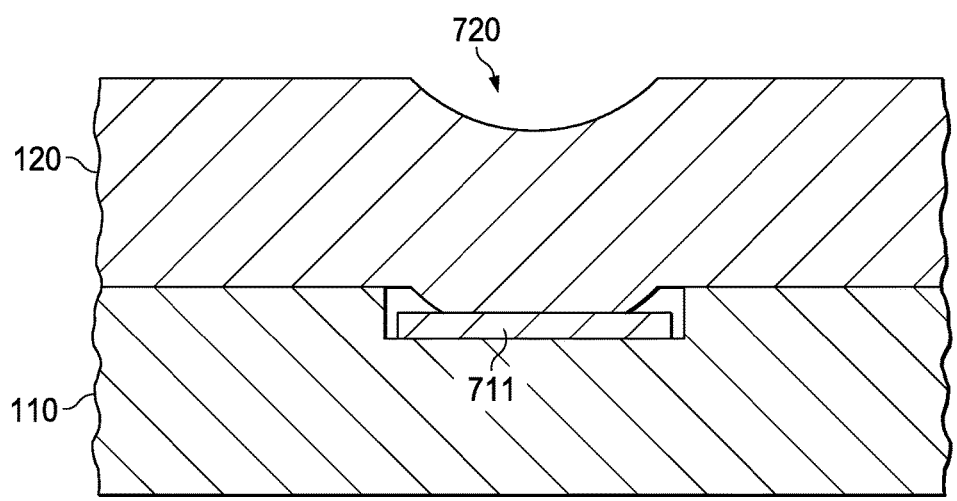
FIG. 7B displays a cross section through a portion of the top and bottom leadframes of a dual leadframe after linking, the linked joint showing the protrusion deformed and soldered with the metal layer in the cavity.

A related other kind of joint and method for mating second leadframe 120 with first leadframe 110 is illustrated in FIGS. 7A and 7B. Leadframe 110, referred to as first or bottom leadframe, has received cavities, or indents or recesses, 710 in first locations of the leadframe surface facing leadframe 120. A preferred technique for creating cavities 710 is stamping; alternatively a coining or etching technique may be used. A layer 711 of tin or another solder alloy is selectively plated onto the bottom of cavity 710. Leadframe 120, referred to as second or top leadframe, has received metal protrusions 720, which may be deformed when mechanical pressure is applied in the direction 730 normal to leadframe 120; protrusions 720 are in second locations matching the first locations. Protrusions 720, also referred to as dimples or notches, are preferably formed by coining; alternatively, a stamping technique may be used. The convex surface 720*a* of protrusion 720 have preferably a metallurgical configuration favorable for soldering.

In the fabrication flow of encapsulated dual leadframes, the sequence of processes includes: Forming cavities 710 in first locations of the first leadframe 110 and protrusions 720 in matching second locations of the second leadframe 120; aligning the second leadframe with the first leadframe to match first and second locations (see FIG. 7A); applying pressure onto the second leadframe until it touches the first leadframe and deforms the protrusions and presses them onto the tin layer 711 of the cavities (see FIG. 7B); raising the temperature to reflow the tin or solder alloy; and placing the dual leadframe in a mold for encapsulating the mated leadframes in an insulating compound while filling the leadframe gaps and thinned-zone portions.

Figure 8A:
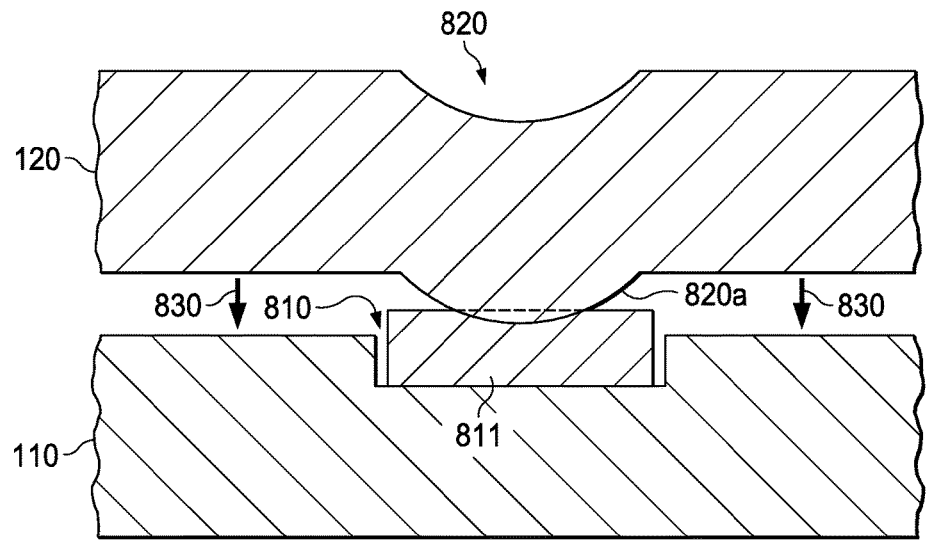
FIG. 8A shows a cross section through a portion of the top and bottom leadframes of a dual leadframe after aligning but before linking, the joint provision of the bottom leadframe providing a cavity with a layer of solder paste, and the joint provision of the top leadframe providing a protrusion with a solderable surface and deformable under pressure.
Figure 8B:
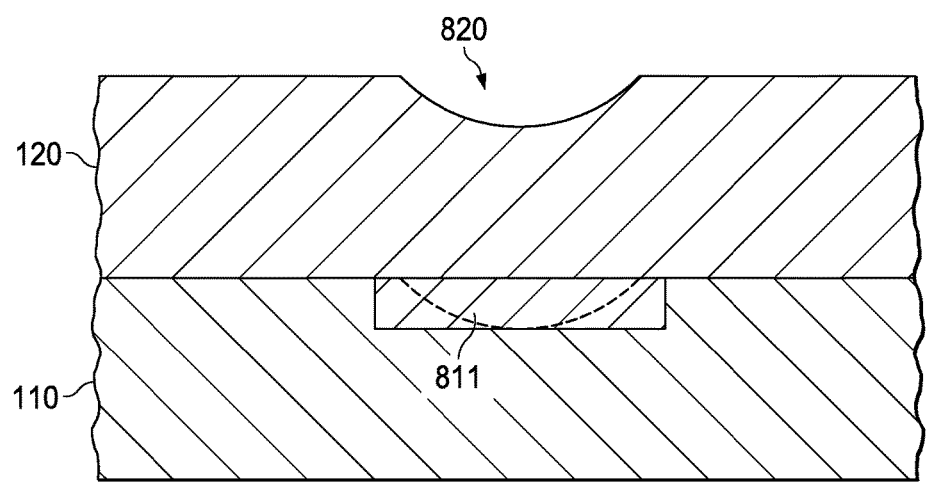
FIG. 8B displays a cross section through a portion of the top and bottom leadframes of a dual leadframe after linking, the linked joint showing the protrusion submerged in the solder paste, deformed, submerged in and soldered with the paste.

Another related kind of joint and method for mating second leadframe 120 with first leadframe 110 is illustrated in FIGS. 8A and 8B. The material printed selectively in the cavities 810 of leadframe 110 is a solder paste 811. Top leadframe 120 has received metal protrusions 820, which may be deformed when mechanical pressure is applied in the direction 830 normal to leadframe 120; the locations of protrusions 820 match the locations of cavities 810. The convex surface 820*a* of protrusion 820 may have a metallurgical configuration favorable for soldering.

In the fabrication flow of encapsulated dual leadframes, the sequence of processes includes: Forming cavities 810 in first locations of the first leadframe 110 and protrusions 820 in matching second locations of the second leadframe 120; aligning the second leadframe with the first leadframe to match first and second locations (see FIG. 8A); applying pressure onto the second leadframe until it touches the first leadframe and deforms the protrusions and presses them into the solder paste layer 811 of the cavities (see FIG. 8B); raising the temperature to reflow the solder paste; and placing the dual leadframe in a mold for encapsulating the mated leadframes in an insulating compound while filling the leadframe gaps and thinned-zone portions.

Figure 9:
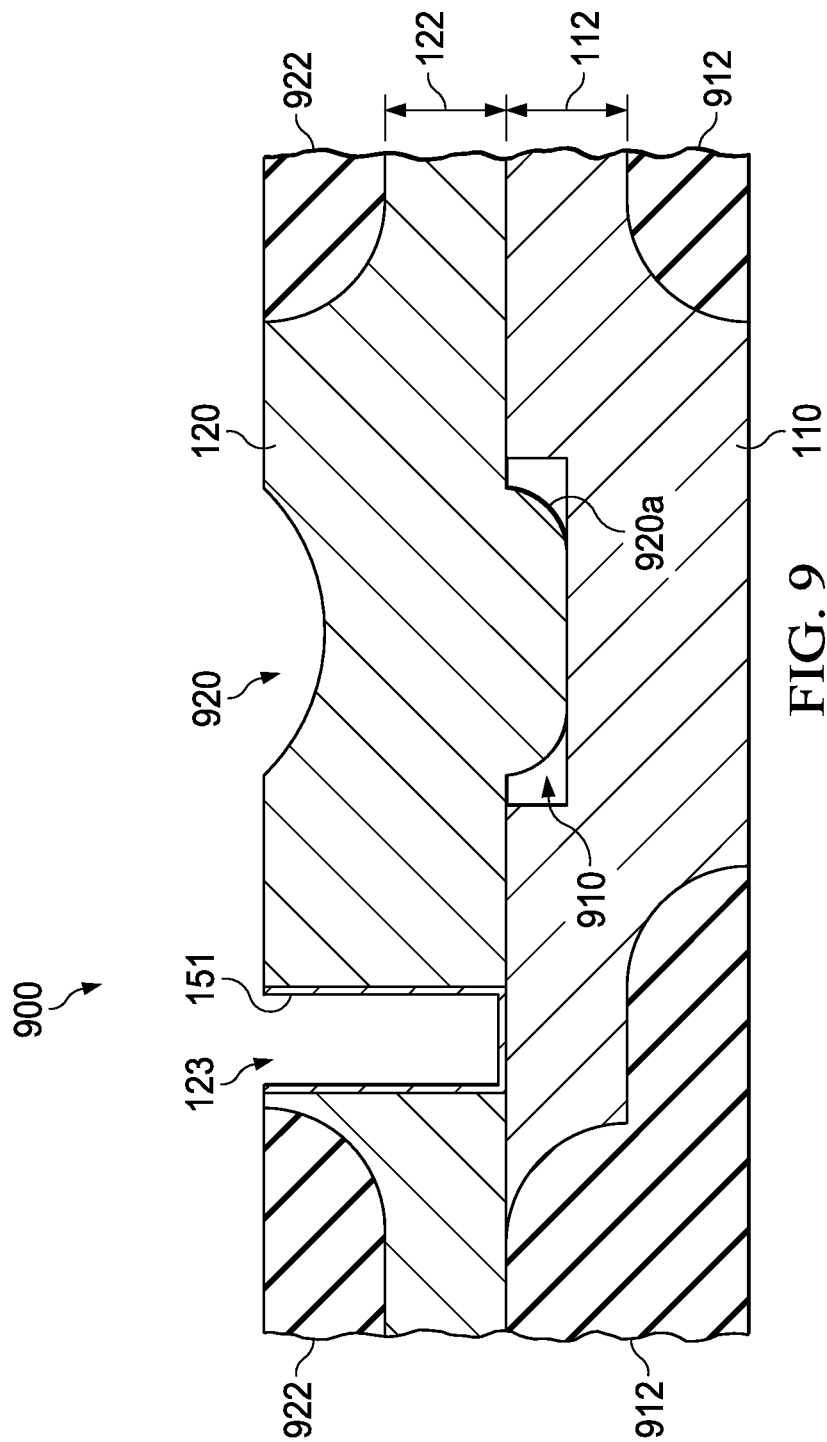
FIG. 9 illustrates a cross section through a portion of the top and bottom leadframes of a dual leadframe summarizing the linking methods described in FIGS. 6A to 8B.

FIG. 9 depicts a portion 900 of mated and encapsulated first (110) and second (120) leadframes. Portion 900 of the mated and pre-molded leadframe combines all four designs and methods for joints described above. Furthermore, both leadframes 110 and 120 exhibit half-etched zones, 112 and 122, respectively. The gaps created by the half-etching process have been filled with encapsulation compound, designated 912 and 922, respectively. Second (top) leadframe 120 includes the joint formed by via hole 123 exhibiting the via walls plated with metal layer 151. Top leadframe 120 further includes protrusion 920; its convex side has been flattened by the mechanical pressure applied during the mating process in order to bring the leadframes to touch. Bottom leadframe 110 exhibits a recess 910 in a location matching the location of protrusion 920.

It is a technical advantage that a pre-molded dual leadframe concurrently offers the fine routing for signals, endowed in the top leadframe, with the power routing and thermal heat dissipation, endowed in the bottom leadframe. It is another technical advantage that pre-molded dual leadframes offer higher reliability during operation and accelerated tests compared to multi-level laminated substrates; the higher reliability is based on eliminating delamination caused by high humidity and frequent temperature cycling. It is an additional advantage that pre-molded dual leadframes can be customized for a variety of multi-chip products, including power converters, while requiring less space and offering substantially lower costs.

Figure 10A:
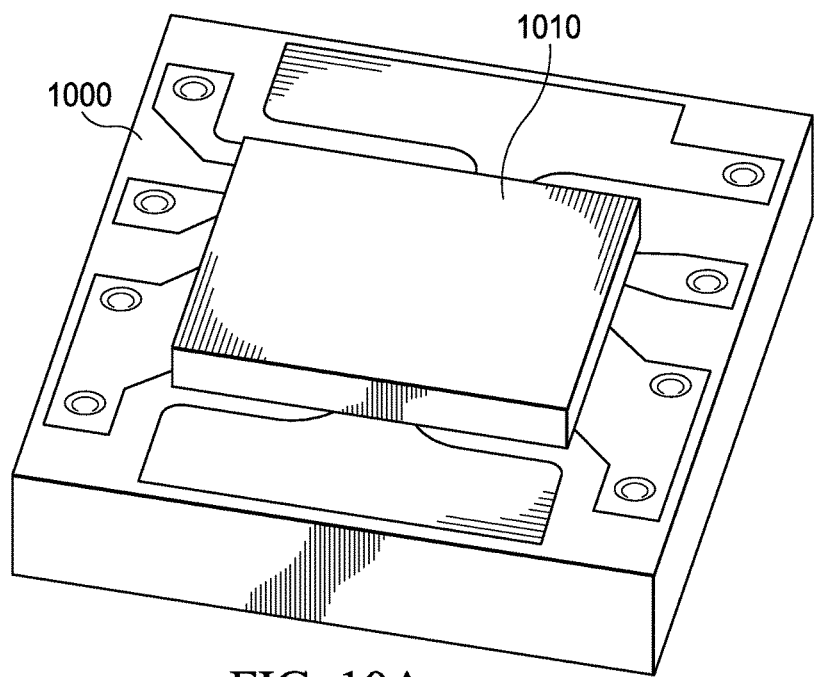
FIG. 10A shows a perspective view of a module including a pre-molded dual leadframe with a semiconductor chip attached to the top module surface.
Figure 10B:
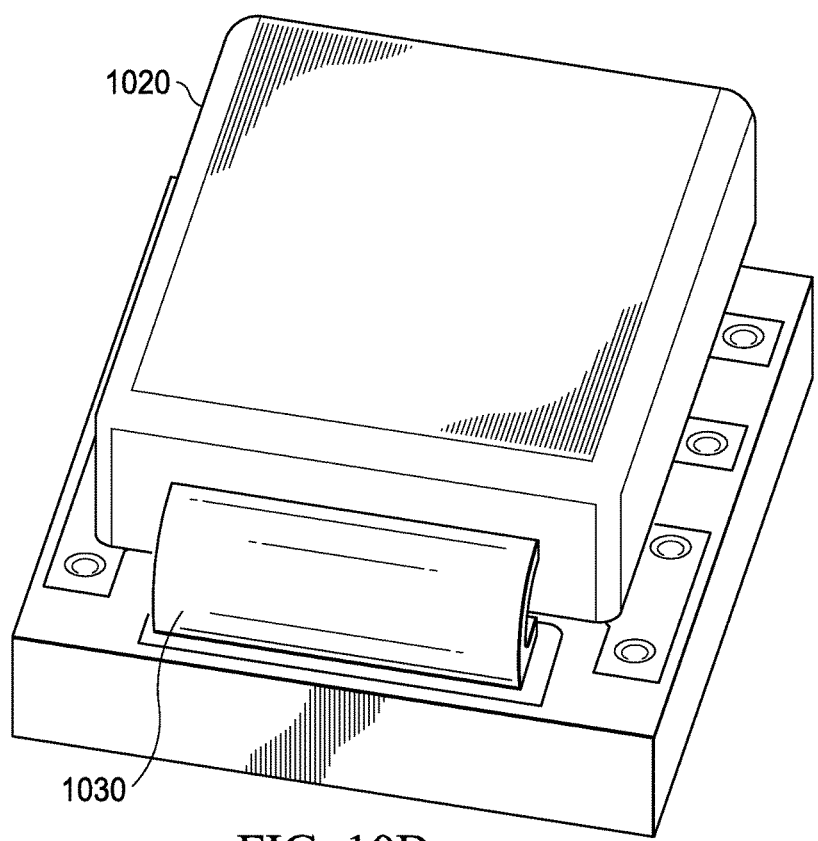
FIG. 10B depicts a perspective view of the module of FIG. 10A with an additional inductor attached to the top module surface.

FIGS. 10A to 15B show exemplary embodiments of semiconductor modules employing pre-molded dual leadframes. In FIG. 10A, a semiconductor chip 1010, which may include a device such as a diode, a transistor, or an integrated circuit, is flip-assembled on the top surface of a pre-molded dual leadframe 1000. As illustrated in FIG. 10B, an inductor 1020 can be mounted directly over chip 1010 using a tall standoff socket 1030 (in this example, the top leadframe pin employed for the mounting is serving the switch node terminal of the device). It is a technical advantage that the multiple processes necessary for reflowing the attachment solders can be combined into a single process step.

Figure 11A:
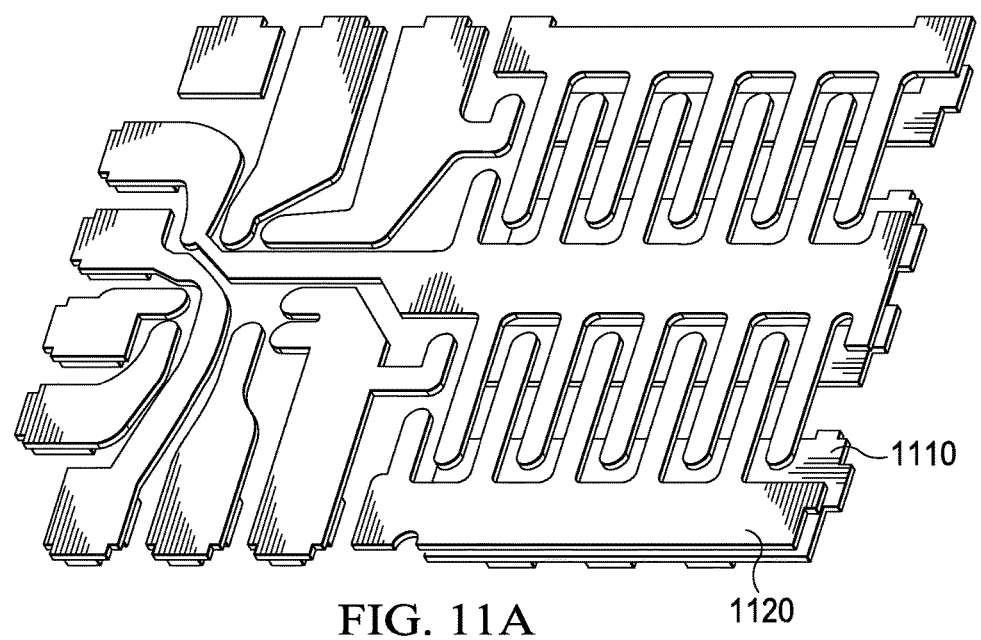
FIG. 11A depicts a perspective view of a dual leadframe customized for a semiconductor system.
Figure 11B:
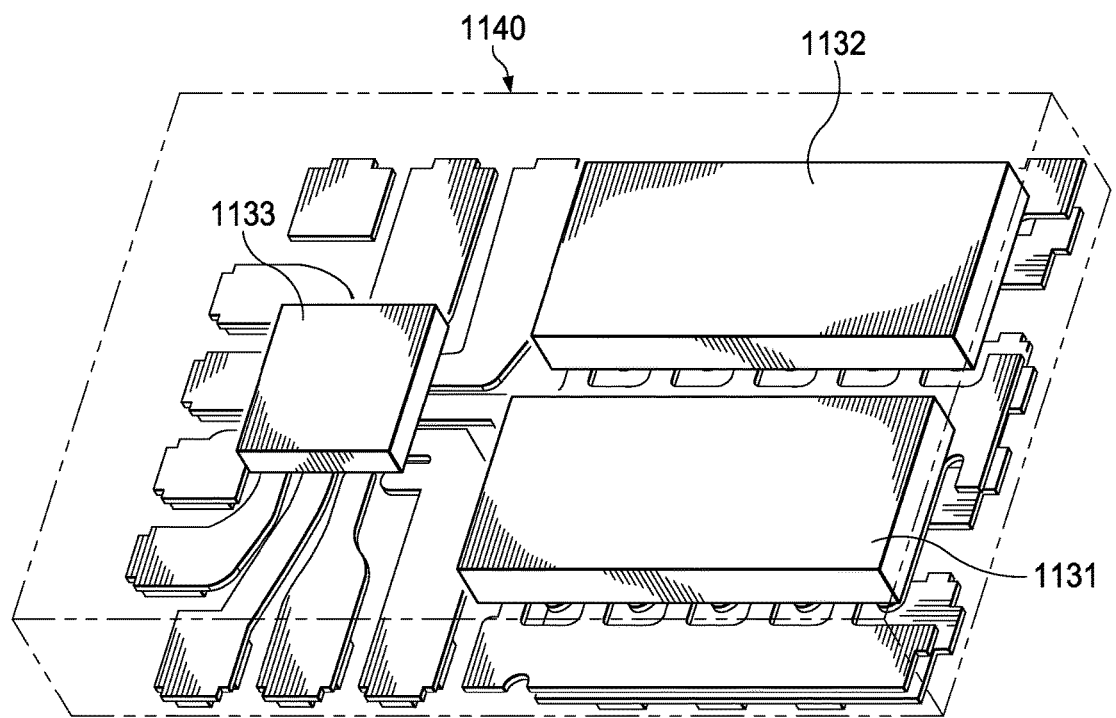
FIG. 11B illustrates a perspective view of a system including the dual leadframe of FIG. 11A and a plurality of semiconductor chips attached to the top surface of the dual leadframe; a package of plastic material may encapsulate the system and fill the gaps of the mated leadframes.

FIGS. 11A and 11B and FIGS. 15A and 15B illustrate embodiments in which active semiconductor chips and passive components are assembled on dual leadframes before the completed module is encapsulated in a package, thus combining the molding process of the dual leadframe with the molding process of the module. In FIG. 11A, the top leadframe 1120 is aligned and mated with bottom leadframe 1110. In this example, the preferred mating technique uses pressure-induced joints as described above. As depicted in FIG. 11B, a plurality of semiconductor chips 1131, 1132, and 1133 is flip-attached onto assembly pads on the top surface of the dual leadframe. Finally, the assembly is encapsulated in a molded package 1140. As stated above, during the molding process, the gaps and thinned-out leadframe portions are filled with molding compound.

It is a technical advantage of dual leadframes that chips and components may not only be assembled on the surfaces of dual leadframes, but they may also be embedded inside dual leadframes. The concept of embedding chips and components in spaces provided by half-etched and aligned dual leadframes prior to the process of encapsulation is demonstrated in schematic FIGS. 12 to 14B.

Figure 12:
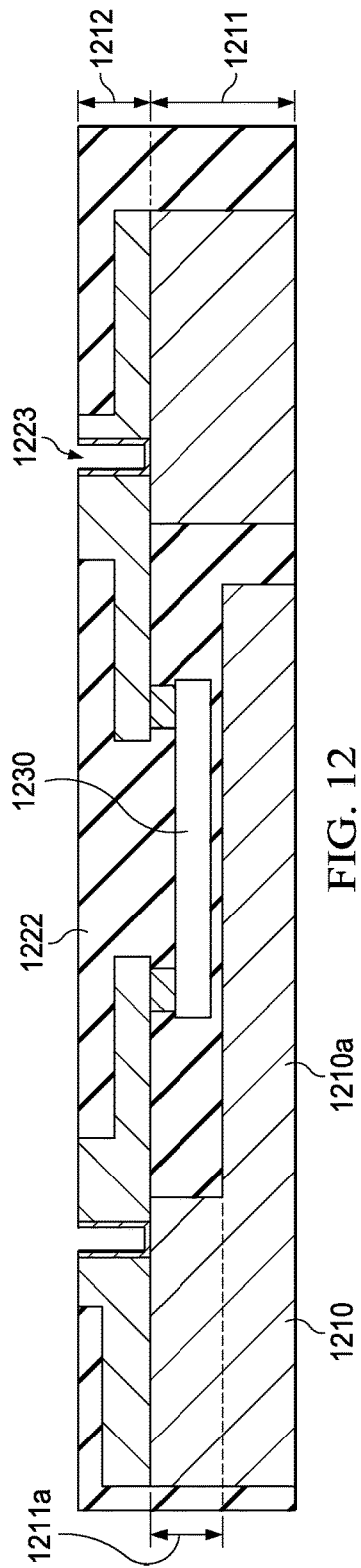
FIG. 12 shows a cross section of a portion of a dual leadframe to illustrate a concept of embedding a semiconductor chip or passive component in the space provided by half-etched leads before mating the leadframes and encapsulating the mated frames in an insulating compound.
Figure 13:
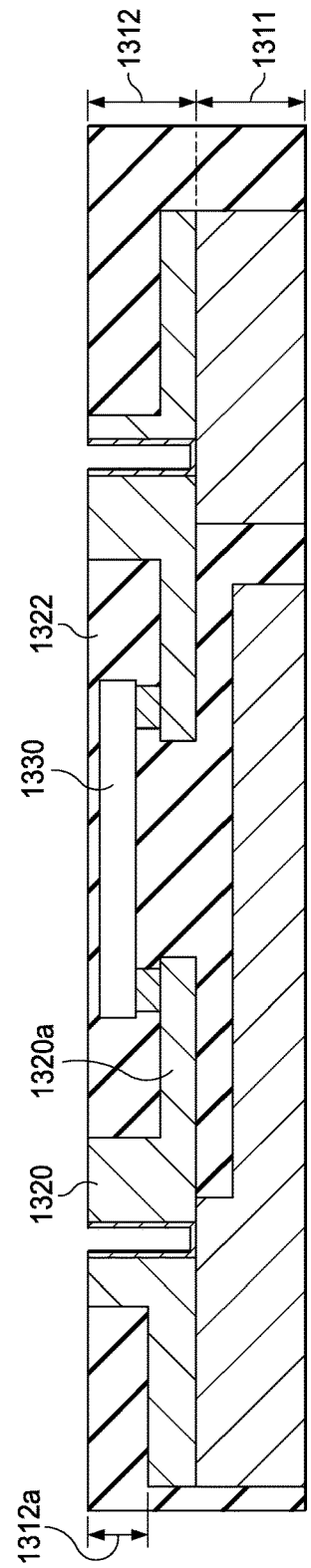
FIG. 13 shows a cross section of a portion of a dual leadframe to illustrate another concept of embedding a semiconductor chip or passive component in the space provided by half-etched leads before mating the leadframes and encapsulating the mated frames in an insulating compound.

FIGS. 12, 13, 14A and 14B illustrate the concept of embedding semiconductor chips in spaces provided by aligned half-etched portions of one or both leadframes of the dual leadframe. In FIG. 13, the first (bottom) leadframe and the second (top) leadframe are made from metal sheets of equal thickness, in FIG. 12, one of the leadframes (the first (bottom) leadframe) is made from a thicker sheet than the second (top) leadframe.

In FIG. 12, the first (bottom) leadframe started with a greater thickness 1211 of the metal sheet in order to allow a portion 1210a of segment 1210 to be thinned by half-etching so that a space of height 1211a is freed up wide enough to accommodate a semiconductor chip or component 1230. Chip (or component) 1230 itself is flip-assembled on the second (top) leadframe. After the assembly, second leadframe is aligned with the first leadframe during the process of mating the first and second leadframes into the dual leadframe. The plated vias operating as joints for the mating process are designated 1223. After the alignment, chip or component 1230 ends up in the central interior of the dual leadframe. In the subsequent molding process, all left-over and infilled spaces of the dual leadframe are filled with insulating material 1222, and chip/component 1230 is embedded in the well protected center of the molded dual leadframe.

In the example of FIG. 13, top and bottom leadframes are of equal thickness (1311 and 1312, respectively), and the process of half-etching is performed using the top leadframe. The freed-up space of height 1312a has to be sufficient to flip-assemble chip/component 1330 on the thinned-out portion 1320a of segment 1320 of the top leadframe. In the subsequent molding process, all left-over and infilled spaces of the dual leadframe are filled with insulating material 1222, and chip/component 1330 is embedded in insulating material. A comparison of the embodiment of FIG. 13 with the embodiment of FIG. 12 shows that the embedding technique of FIG. 13 may require a somewhat reduced thickness of chip or component 1330 compared to the chip or component 1230.

Figure 14A:
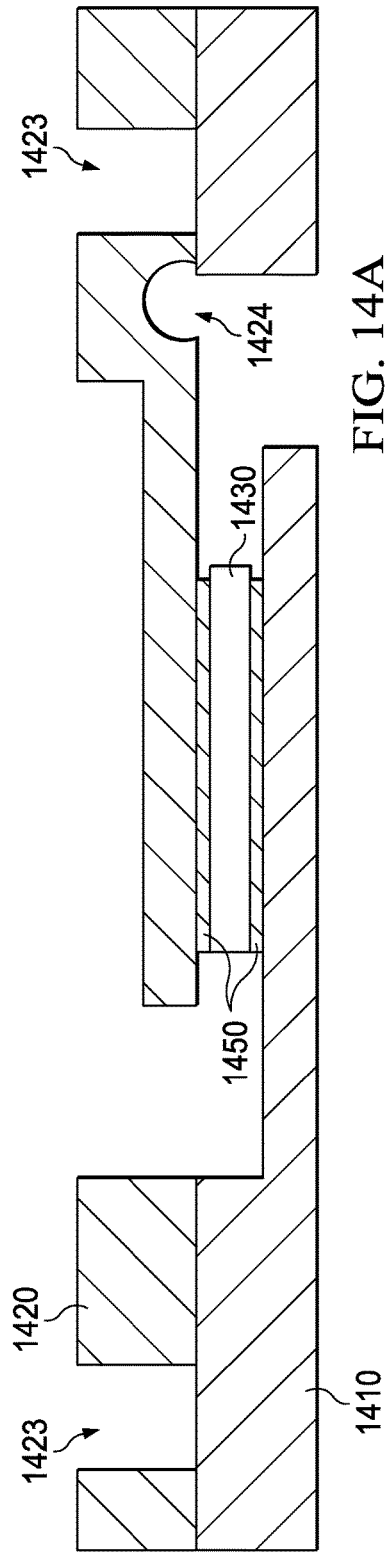
FIG. 14A displays a cross section of a portion of a dual leadframe to illustrate yet another concept of embedding a semiconductor chip or passive component in the space provided by half-etched leads before mating the leadframes.
Figure 14B:
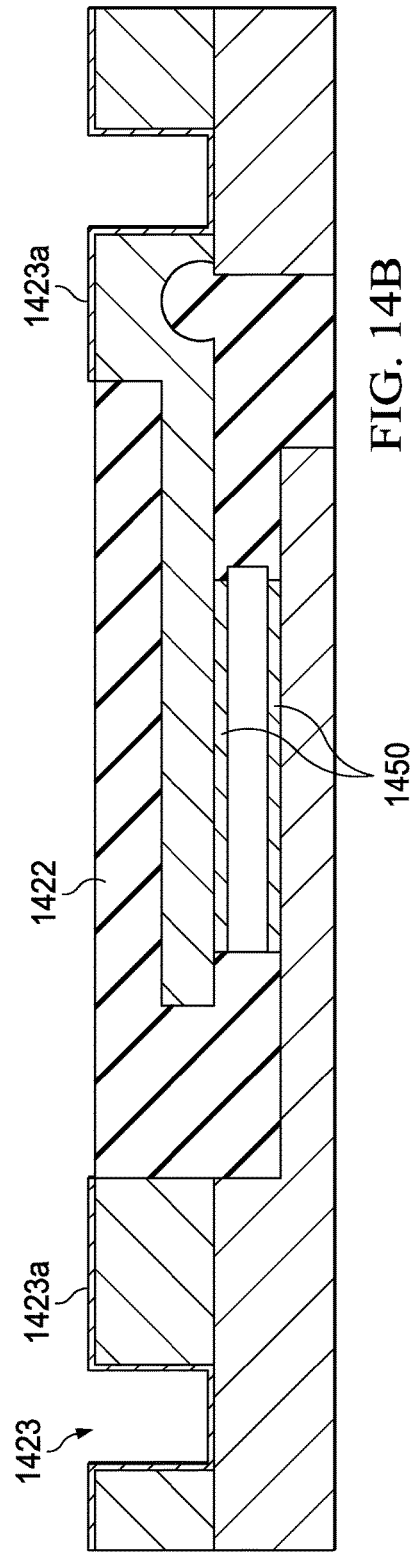
FIG. 14B displays a cross section of the dual leadframe portion of FIG. 14A after mating the leadframes and encapsulating the system in a plastic package.

FIGS. 14A and 14B display another concept for embedding chips and components in molded dual leadframes, wherein the die or component is attached to both leadframes concurrently, however not by the flip-chip process, but by a process involving solder, tin layers, or conductive adhesive material. In FIG. 14A, both first leadframe 1410 and second leadframe 1420 have half-etched portions to create the space needed for attaching a chip or component 1430. Second leadframe 1420 further includes via hole etchings 1423 as joints in preparation for mating the leadframes, and etchings 1424 as stress relief features as a chip protection scheme to allow leadframe clamping during the mating process. Chip or component 1430 is attached to both leadframes using layers 1450 of tin, solder (requiring a reflow process), or conductive adhesive.

After chip attachment, the molding process is performed, as illustrated on FIG. 14B. After molding insulating material 1422, via holes obtain the plated metal layers 1423a.

Figure 15A:
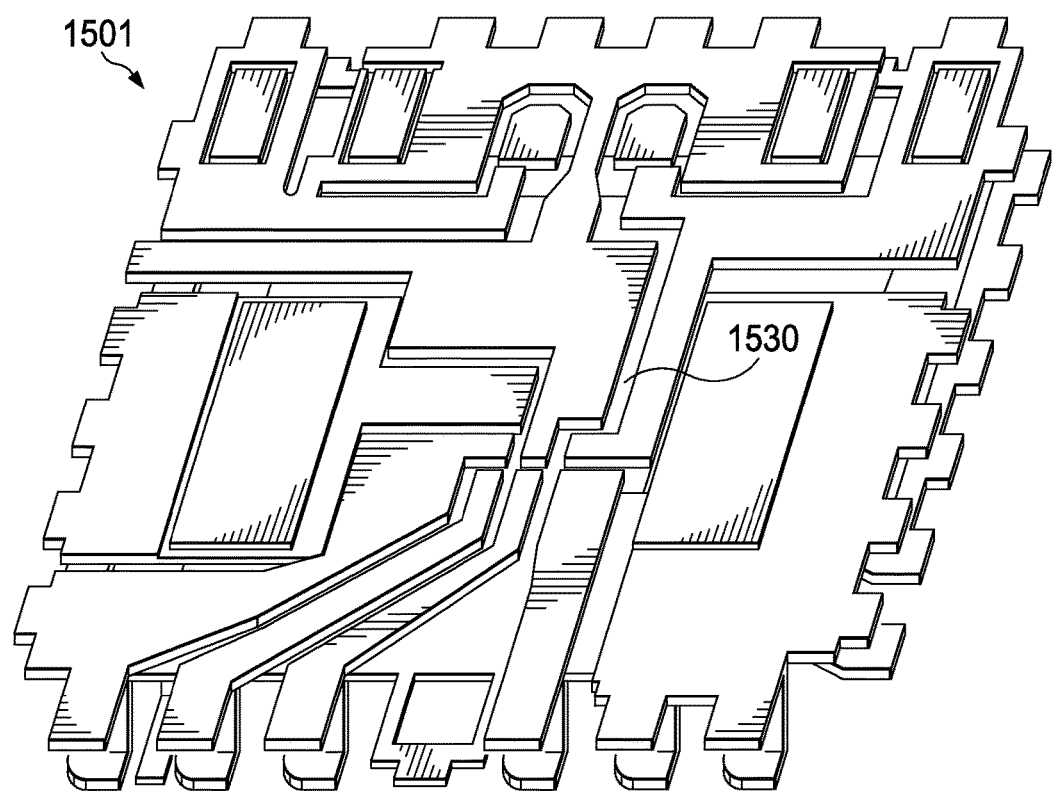
FIG. 15A depicts a perspective view of another dual leadframe including embedded chips, customized for a semiconductor system.
Figure 15B:
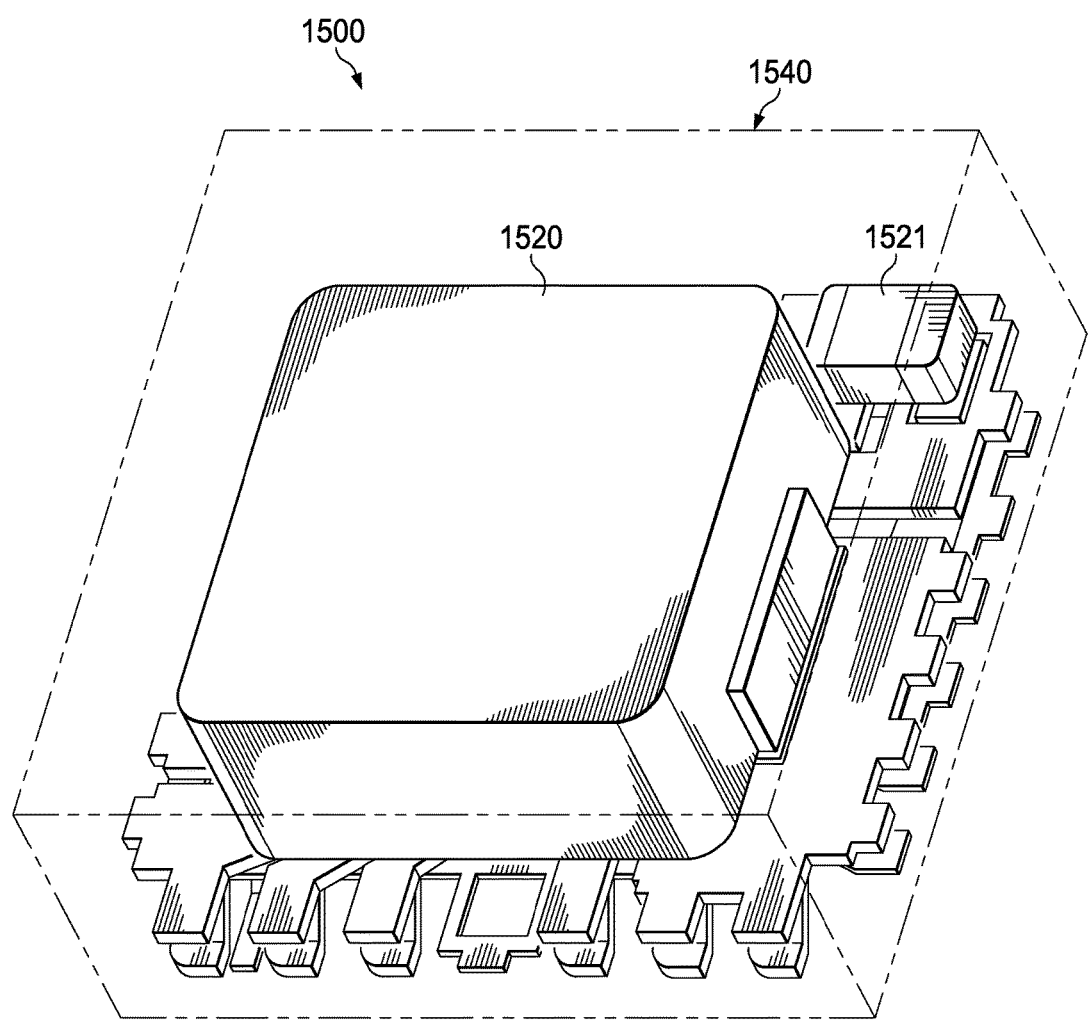
FIG. 15B illustrates a perspective view of a system including the dual leadframe of FIG. 15A and a plurality of passive components attached to the top surface of the dual leadframe; a package of plastic material may encapsulate the system and fill the gaps of the mated leadframes.

FIG. 15B depicts a molded power switch module 1500 integral with attached capacitors and inductor, which is based on the dual leadframe 1501 displayed in FIG. 15A. Leadframe 1501 includes one or more chips 1530 assembled in the space between the leadframes, and may have attached one or more chips to the top surface. FIG. 15B shows the packaged passive components 1520 and 1521 attached to the top surface of the dual leadframe, before the whole assembly is encapsulated in insulating compound 1540.

It is a technical advantage that the higher reliability of dual leadframes compared to multi-level laminates by eliminating dalamination enables higher reliability of products such as the power converter of FIG. 15B. It is an additional technical advantage that such products as the power converter can take advantage of geometrical scaling based on the finer routing available in dual leadframes, the capability to embed chips in spaces provided by half-etched dual leadframes, and the ability to incorporate passive components.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the invention applies to semiconductor chips including field effect transistors, bipolar transistors, power transistors, and integrated circuits. An another example, the invention applies to chips made of silicon, silicon germanium, gallium arsenide, gallium nitride, of any other III-V and II-VI compound used in product manufacturing.

As another example, the bottom surface of the first leadframe, which is also the bottom surface of the dual leadframe, may be attached to a heat sink, preferably by soldering. In this fashion, the high current and heat dissipating capabilities of the modules can be further extended, and the efficiency further enhanced.

As yet another example, passive components such as inductors can be used in a wide variety of shapes (flat, tall, etc.) and directly off the shelf, shortening the time to market and saving cost.

It is therefore intended that the appended claims encompass any such modifications or embodiments.

We claim:

1. A semiconductor system comprising:
a molded dual leadframe having a surface with coplanar metallic and insulating regions, the dual leadframe including a first leadframe formed below and linked with a second leadframe, the first leadframe including zones of a first metal thickness and zones of a second metal thickness smaller than the first thickness, and the second leadframe including zones of a third metal thickness and zones of a fourth metal thickness smaller than the third thickness;
a first active semiconductor chip flip-attached to metallic regions of the surface; and
a passive electronic component conductively attached to metallic regions of the surface.

2. The system of claim 1 wherein the dual leadframe includes locations having a space volume formed between a metal zone of second thickness aligned with a metal zone of fourth thickness, the space volume suitable to house a second active semiconductor chip.

3. The system of claim 2, wherein the first and the second active semiconductor chips are the transistors and integrated circuits of a power supply converter, and the passive component is an inductor roofing over the first chip.

4. The system of claim 3 wherein the semiconductor chips are made of a material selected from a group including silicon, silicon germanium, gallium nitride, and gallium arsenide.

5. A semiconductor system comprising:
a dual leadframe including a first leadframe formed below and linked with a second leadframe, the first leadframe including zones of a first metal thickness and zones of a second metal thickness smaller than the first thickness, and the second leadframe including zones of a third metal thickness and a fourth metal thickness smaller than the third thickness; the dual leadframe having no electronic devices located between the first leadframe and the second leadframe; and
at least one semiconductor chip attached to the top surface of the dual leadframe.

6. The system of claim 5 further including at least one passive electronic component attached to the top surface of the dual leadframe.

7. The system of claim 6 further including a molded package encapsulating the dual leadframe with the at least one semiconductor chip attached.

8. A semiconductor system comprising:
a dual leadframe including a first leadframe formed below and linked with a second leadframe, the first leadframe including zones of a first metal thickness and zones of a second metal thickness smaller than the first thickness, and the second leadframe including zones of a third metal thickness and a fourth metal thickness smaller than the third thickness;
at least one semiconductor chip attached to the top surface of the dual leadframe; and
locations of the dual leadframe where metal zones of second thickness are aligned with metal zones of fourth thickness, the locations forming spaces suitable for housing electronic components.

9. The system of claim 8 wherein at least one of the spaces has a semiconductor chip attached to the dual leadframe, embedding the chip inside the dual leadframe before encapsulating the dual leadframe.

10. The system of claim 5 wherein the semiconductor chips are made of a material selected from a group including silicon, silicon germanium, gallium nitride, and gallium arsenide.

11. A semiconductor system, comprising:
a first leadframe having zones of a first thickness and a second thickness and having at least one first joint location;
a second leadframe formed over the first leadframe, the second leadframe having zones of a third thickness and a fourth thickness and having at least one second joint location;
an electrical connection formed by the at least one first joint location contacting the at least one second joint location; and
a semiconductor device electrically connected to at least one of the first and second leadframes.

12. The system of claim 11, comprising at least one passive electronic component electrically connected to at least one of the first and second leadframes.

13. The system of claim 11, comprising a molded package encapsulating the first and second leadframes.

14. The system of claim 11, wherein a zone of the second thickness is aligned with a zone of fourth thickness to form a space for the semiconductor device.

15. The system of claim 14, wherein the semiconductor device is electrically connected to at least one of the first and second leadframes between a lower surface of the first leadframe and an upper surface of the second leadframe.

16. The system of claim 11, wherein the semiconductor device is electrically connected to an upper surface of the second leadframe.

17. The system of claim 11, wherein the electrical connection formed between the at least one first joint location and the at least one second joint location comprises solder alloy.

18. The system of claim 11, wherein the electrical connection formed between the at least one first joint location and the at least one second joint location comprises metal plating.

19. The system of claim 11, wherein the electrical connection between the semiconductor device and the at least one of the first and second leadframes comprises flip-chip bonding.

20. The system of claim 11, wherein the second thickness is less than the first thickness, and wherein the fourth thickness is less than the third thickness, and wherein the second and fourth thicknesses are formed by a half-etch process.

* * * * *